United States Patent
Figie et al.

(10) Patent No.: US 11,381,181 B2
(45) Date of Patent: Jul. 5, 2022

(54) SYSTEM FOR ADJUSTING ALIGNMENT AND LOCATION OF A MAGNET IN A MOVER OR OTHER MOUNTING COMPONENT

(71) Applicant: Rockwell Automation Technologies, Inc., Mayfield Heights, OH (US)

(72) Inventors: David A. Figie, Menomonee Falls, WI (US); Juan A. Fernandez, Brown Deer, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 58 days.

(21) Appl. No.: 17/004,352

(22) Filed: Aug. 27, 2020

(65) Prior Publication Data

US 2022/0069745 A1 Mar. 3, 2022

(51) Int. Cl.
| | |
|---|---|
| *H02P 6/16* | (2016.01) |
| *H02P 6/00* | (2016.01) |
| *H02K 11/215* | (2016.01) |
| *H02P 25/064* | (2016.01) |
| *H02K 41/03* | (2006.01) |

(52) U.S. Cl.
CPC ............ *H02P 6/006* (2013.01); *H02K 11/215* (2016.01); *H02K 41/031* (2013.01); *H02P 6/16* (2013.01); *H02P 25/064* (2016.02)

(58) Field of Classification Search
CPC .......... H02P 6/16; H02P 6/006; H02P 25/064; H02K 11/215; H02K 41/031
See application file for complete search history.

(56) References Cited

U.S. PATENT DOCUMENTS

| | | | |
|---|---|---|---|
| 10,479,216 B2 | 11/2019 | Clark et al. | |
| 10,723,232 B2 * | 7/2020 | Gurevich | B60L 13/06 |
| 2008/0084122 A1 * | 4/2008 | Koide | H02P 6/16 |
| | | | 355/72 |

OTHER PUBLICATIONS

Publication titled "*iTRAK® The Intelligent Track System, Increase machine flexibility and throughput to enhance overall productivity*", Rockwell Automation, Publication No. Motion-BR007A-EN-P, Jul. 2015.

* cited by examiner

*Primary Examiner* — Cortez M Cook
(74) *Attorney, Agent, or Firm* — Fay Sharpe LLP

(57) ABSTRACT

A system and method for adjusting the alignment and location of a magnet. A first actuator exerts a first applied force to urge the magnet in a first axial direction and a first biasing device exerts a first opposing force. The first applied force and opposing forces are modulated relative to each other to position the magnet at a lateral location. A second actuator exerts a second applied force to urge the magnet in a first angular direction about a pivot axis and a second biasing device exerts a second opposing force. The second applied and opposing forces are modulated relative to each other to position the magnet at a select angular orientation relative to the magnet holder. The magnet is secured to the magnet holder after positioning. The magnet can also be rotated about its geometric centerline to position its magnetic axis.

20 Claims, 11 Drawing Sheets

SYSTEM FOR ADJUSTING ALIGNMENT AND LOCATION OF A MAGNET IN A MOVER OR OTHER MOUNTING COMPONENT

BACKGROUND INFORMATION

Modern industrial equipment often includes a magnetic system for sensing and/or controlling the position of one component or structure relative to another. In many cases, a permanent magnet is immovably mounted to a first component that moves relative to a second component, or vice versa, and the presence and/or position of the magnet is sensed using one or more magnetic position sensors such as a Hall-effect sensor, an AMR (Anisotropic Magneto Resistive) sensor, a GMR (Giant Magneto Resistive) sensor and/or another magnetic position sensor.

Regardless of the type of magnetic position sensor used, any misalignment or other error in the position of the permanent magnet relative to the component to which it is immovably mounted can lead to inaccurate sensing/position data when the magnet is detected by a magnetic position sensor. In particular, when the magnet is detected by the magnetic position sensor, the actual position of the component carrying the magnet will vary depending upon any variation or error in the mounting location and orientation of the magnet on the component carrying the magnet.

A permanent magnet includes or defines a polar axis or magnetic axis that passes through the north and south poles of the magnetic field of the magnet. In a typical XYZ three-dimensional coordinate system, a movable component that moves in an XZ plane (such as along a horizontal X axis in a plane that also includes a vertical Z axis) will typically include a permanent magnet mounted thereon with its magnetic axis: (i) oriented perpendicular with respect to the X and Z axes (parallel with respect to the Y axis or YZ plane); and (ii) located at a select linear or axial position along the X axis with respect to a fixed and known reference plane or other datum of the movable mounting component. Variation of either the angular position of the magnetic axis about the Z axis or the axial position of the magnetic axis along the X axis relative to the reference datum of the mounting component can undesirably affect the ability to accurately detect the presence and/or position of the magnet (and its mounting component) using a magnetic position sensor.

FIG. 1A (prior art) illustrates one example of an industrial automation motion control system that uses magnetic position sensing. In particular, FIG. 1A provides an isometric view of a linear motor track system TS available commercially from Rockwell Automation under the registered trademark ITRAK®. The linear motor track system TS includes a system housing SH in which electronic components are enclosed including a plurality of magnet position sensors PS that extend adjacent a track or rail R. The rail R can include linear and/or curved segments and can form a continuous loop as shown or can have opposite ends that are disconnected from each other. At least one and typically multiple movers V (only one shown) are operably movably engaged with the rail R and move bi-directionally along the rail R as indicated by the arrow A in a feedback-controlled manner as controlled by the motor electronics contained in the system housing SH based upon the output of the magnet position sensors PS which sense or detect a permanent "position" magnet M' (see also FIG. 1B) carried by each mover V. The permanent position magnet M' is part of a position magnet assembly PMA' including the permanent position magnet M' and a position magnet housing or holder MH'. When multiple movers V are operably installed, they can be synchronized to move in unison with respect to each other or they can be independently controlled and move independently with respect to each other, depending on programming.

As shown in FIG. 1B, each mover V also comprises a motor magnet housing MMH affixed to a support wall thereof and in which one or more permanent motor magnets MM are mounted so that the magnet(s) MM are located in the electromagnetic field of motor coils MC of the system housing SH such that the mover V can be electromagnetically propelled along the rail R by selectively energizing the motor coils MC.

FIG. 1C is similar to FIG. 1B but shows an alternative mover V2 that is similar to the mover V except for the configuration and structure of the position magnet assembly PMA" which includes a permanent position magnet M mounted in a position magnet housing or holder MH". Specifically, FIG. 1C shows a rectangular position magnet M mounted in a corresponding rectangular recess MR" of the magnet holder MH" while FIG. 1B shows a cylindrical position magnet M' mounted in a cylindrical recess MR' of the magnet holder MH'.

FIG. 1D provides a partial section view as taken at view line D-D of FIG. 1C and shows the magnet holder MH" and the permanent magnet M affixed thereto in the recess MR". The magnet M is immovably mounted to the magnet holder MH" in a select position with respect to the three-dimensional XYZ coordinate system as described above such that:

the X axis position of the magnet M determines the X axis position of the magnet M between opposite first (left) and second (right) lateral sides MHa",MHb" of the magnet holder MH" (for a linear segment of the rail R, the X axis corresponds to and lies parallel to the movement direction A in which the mover V2 moves along a linear segment of the rail R);

the Y axis position of the magnet M determines the Y axis position of the magnet M between opposite front and rear faces MHc",MHd" of the magnet holder MH";

the Z axis position of the magnet M determines the position of the magnet M along the Z axis between opposite upper (top) and lower (bottom) sides MHe", MHf" of the magnet holder MH' (see also FIG. 1C).

The magnet M includes or defines a polar or magnetic axis MX such that the magnet M includes opposite north and south magnetic poles N,S that are spaced apart from each other along the magnetic axis MX. The magnet M also includes: (i) opposite first (left) and second (right) lateral sides Ma,Mb located on opposite lateral sides of the magnetic axis MX and spaced apart from each other along the X axis; (ii) opposite north and south faces Mc,Md oriented respectively toward the north and south poles N,S and spaced apart from each other along the Y axis; (iii) opposite upper (top) and lower (bottom) sides Me,Mf (see FIG. 1C) spaced apart from each other along the Z axis; and, (iv) a geometric centerline CL that is located halfway or at the midpoint between its opposite first and second lateral sides Ma,Mb along the X axis.

It is optimal to mount the magnet M in the magnet holder MH',MH" such that its magnetic axis MX: (i) lies parallel to the YZ plane (parallel to the Y axis); and (ii) is located at a known X axis location relative to (or X-axis distance from) a fixed reference point or "datum" of the magnet holder MH',MH". In one non-limiting example, such a reference point or datum of the magnet holder MH' is provided by an imaginary alignment plane that includes or is coincident with a known fixed location of the magnet holder MH, e.g., an alignment plane AP that is coincident with or tangent to the second (right) lateral side MHb" of the magnet holder MH' as shown herein.

FIG. 1E is identical to FIG. 1D except that it illustrates two common magnet mounting errors that lead to magnet position sensing errors as described above. As shown in FIG. 1E, when the magnet M is affixed to the magnet holder MH',MH" the magnetic axis MX is often misaligned such that it is angularly rotated about the Z axis so that its magnetic axis MX is angularly offset relative to the Y axis such that an magnetic axis offset angle theta Θ is defined between the y axis and the magnetic axis MX with its vertex located on the Z axis. Also, the magnet M is often manufactured with its magnetic axis MX laterally offset in one direction or the other with respect to the geometric centerline CL of the magnet by a magnetic axis offset distance D. Either of these magnet mounting errors lead to the magnetic position sensors PS sensing the magnet too early or too late as compared to the ideal magnet mounting arrangement shown in FIG. 1D, which leads to corresponding errors in the sensed or controlled position of the mover V,V2. In one example, rotation of the magnetic axis MX about the Z axis by an angle of 1 degree can cause an X axis position error of 130 microns with respect to the position of the magnet M as detected by one of the magnet position sensors PS. Similarly, the magnetic axis offset distance D can be up to 250 microns or more and can lead to a 1:1 corresponding magnet position sensing error.

Accordingly, a need has been identified for a mechanical system for adjusting the alignment and position of the magnet M with respect to a magnet holder MH',MH" or other mounting structure to which the magnet M is mounted to minimize the above described magnet position errors with respect to the Z axis angular orientation θ and X axis offset D of the magnet axis MX.

BRIEF DESCRIPTION

In accordance with one aspect of the present development, an adjustment system for adjusting the alignment and location of a magnet includes a magnet holder and a magnet carried by the magnet holder. A first actuator exerts a first applied force on the magnet to urge the magnet in a first axial direction and a first biasing device exerts a first opposing force on the magnet to urge the magnet in a second axial direction opposite the first axial direction. A magnet fastener immovably secures the magnet to magnet holder in an operative position.

In accordance with another aspect of the present development, an adjustment method for adjusting the alignment and location of a magnet relative to at least one of first and second sensor reference positions includes: (a) providing a magnet holder and a magnet carried by the magnet holder; and (b) one of: (i) sensing a magnetic field of the magnet at both said first and second sensor reference positions and adjusting a lateral position of said magnet along an X-axis if respective X-axis components of the magnetic field at both said first and second sensor reference positions have the same sign; (ii) sensing the magnetic field of the magnet at both said first and second sensor reference positions and adjusting an angular position of said magnet about a pivot axis that is perpendicular to said X-axis if said respective X-axis components of the magnetic field at both said first and second sensor reference positions have opposite signs; (iii) sensing a magnetic field of the magnet at one or both of the first and second sensor reference positions and adjusting a rotational position of said magnet about a central axis of said magnet. The method further comprises repeating step (b) until a magnetic axis of said magnet is located at a desired position.

In accordance with a further aspect of the present development, an adjustment method for adjusting the alignment and location of a magnet includes: (a) sensing a magnetic field of a magnet at first and second sensor reference positions; (b) one of: (i) laterally adjusting a position of said magnet along an X-axis if respective X-axis components of the magnetic field at both said first and second sensor reference positions have the same sign; (ii) angularly adjusting a position of said magnet about a pivot axis that is perpendicular to said X-axis if said respective X-axis components of the magnetic field at both said first and second sensor reference positions have opposite signs; (c) iteratively repeating steps (a) and (b) until a magnetic axis of said magnet is located at a desired position relative to said first and second sensor reference positions.

DETAILED DESCRIPTION

Figure 1A:
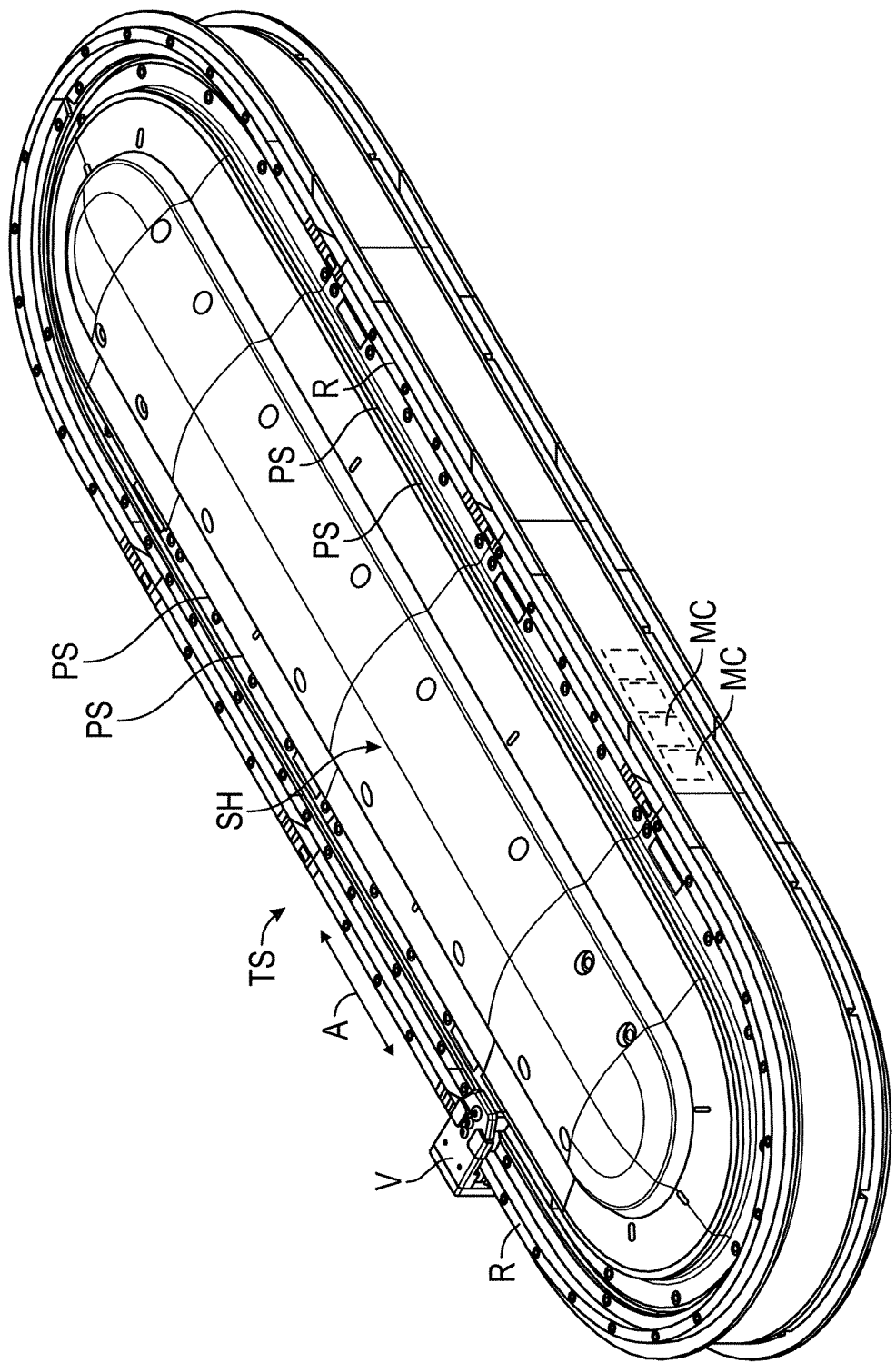
FIG. 1A (prior art) illustrates one example of is an industrial automation motion control system that uses magnetic position sensing.
Figure 1B:
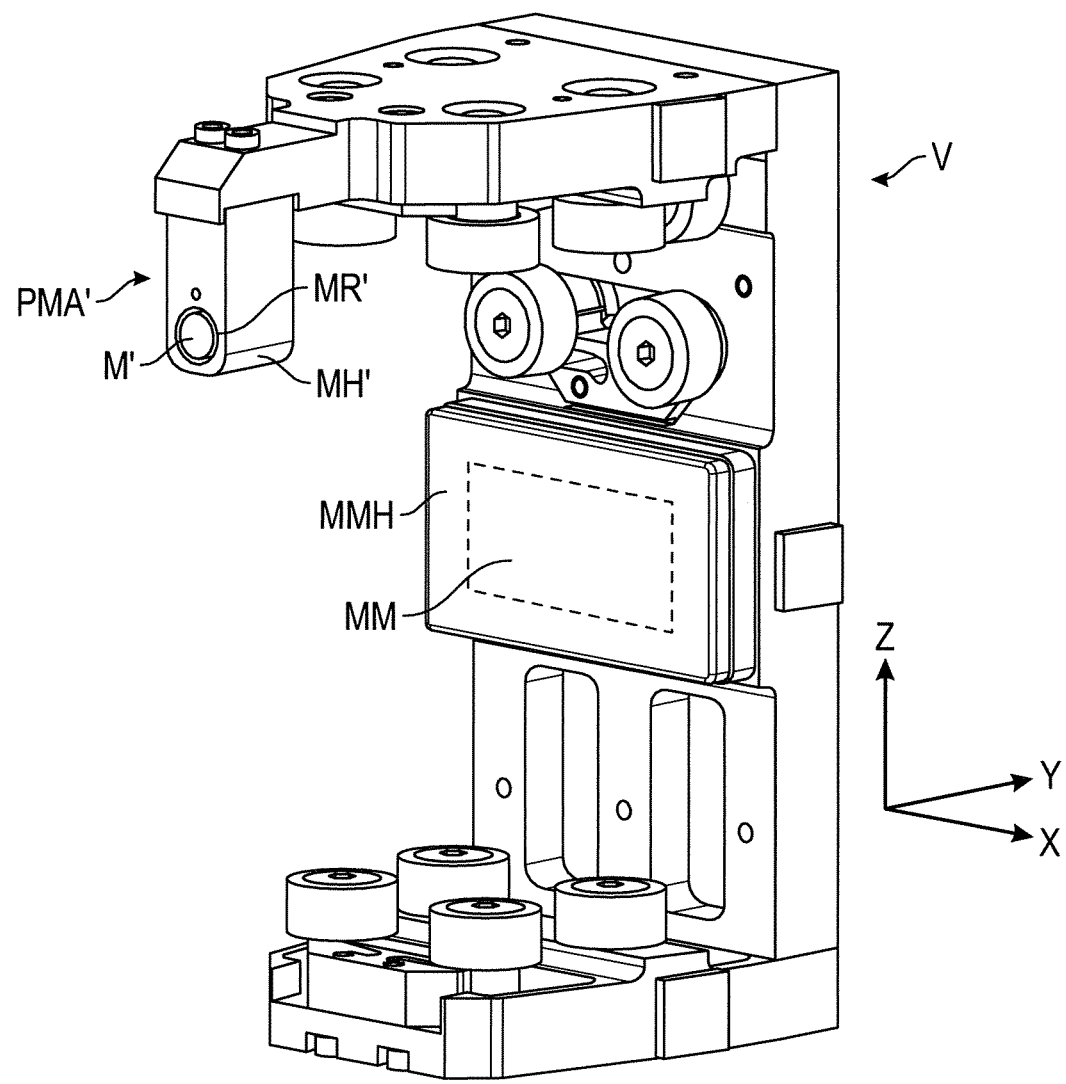
FIG. 1B is an isometric view of a mover that is included as part of the system of FIG. 1A.
Figure 1C:
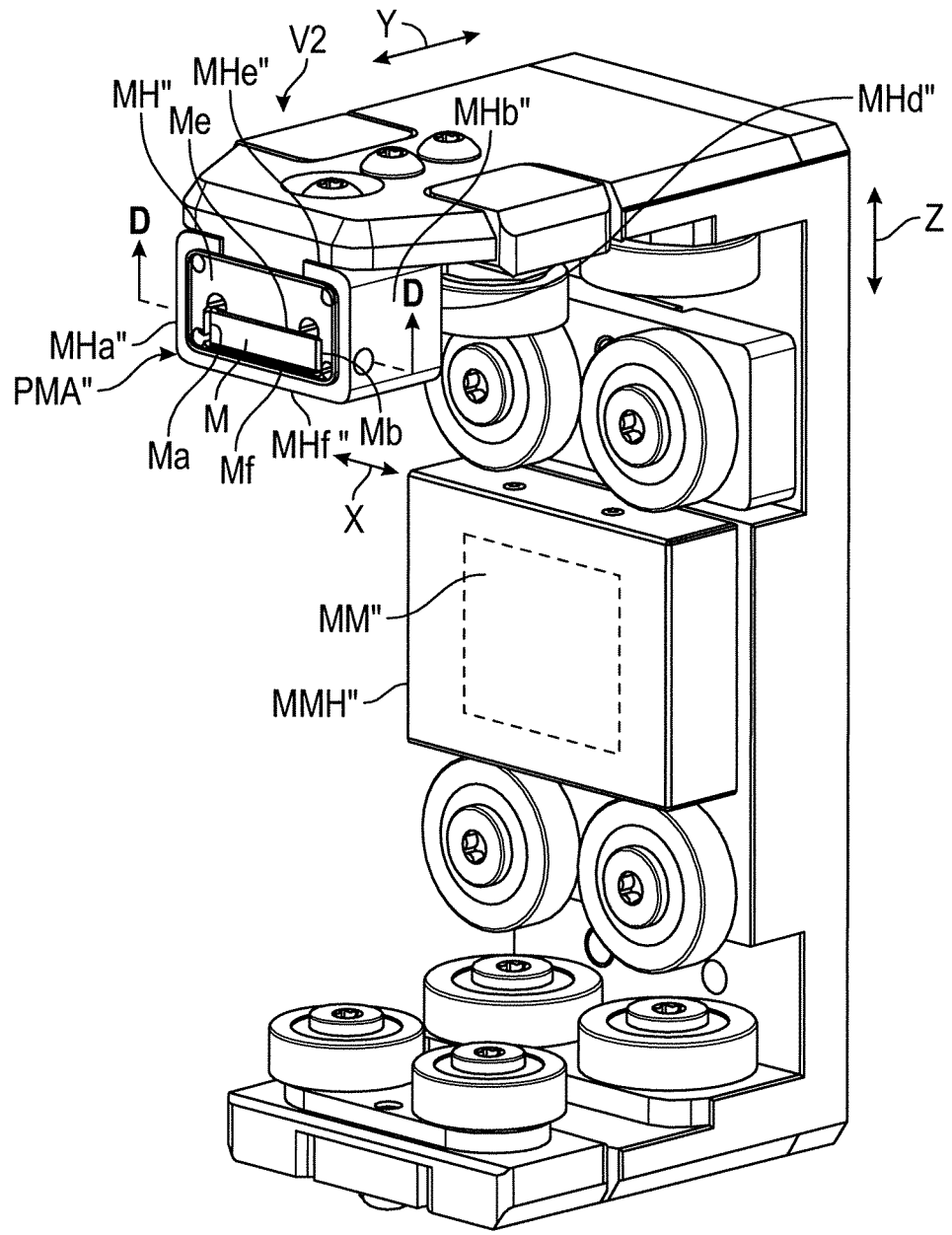
FIG. 1C is similar to FIG. 1B but shows an alternative mover V2 that is similar to the mover V.
Figure 1D:
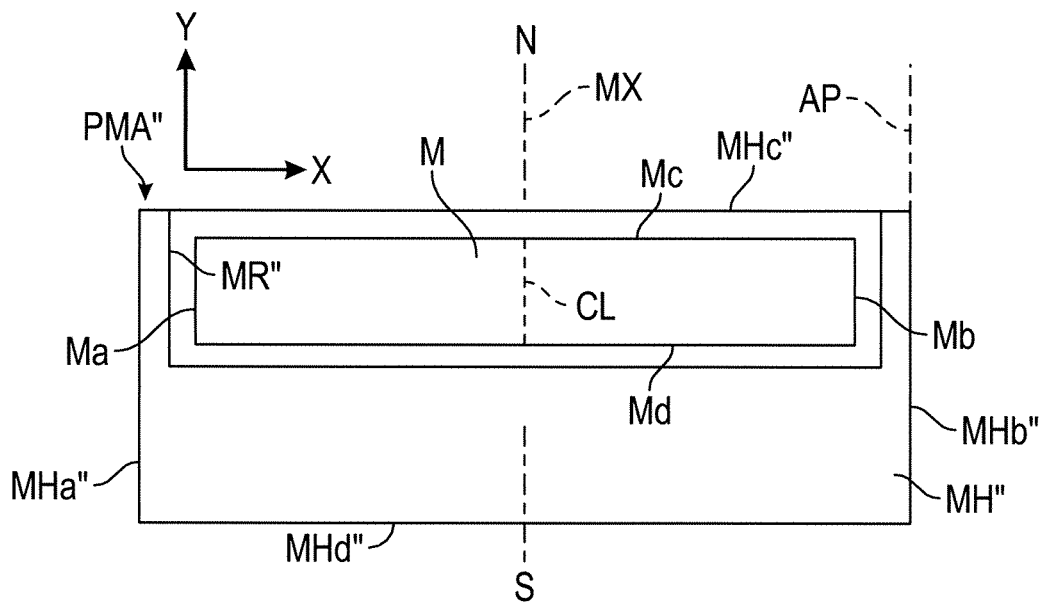
FIG. 1D provides a partial section view as taken at view line D-D of FIG. 1C and shows the magnet housing and a magnet affixed thereto.
Figure 1E:
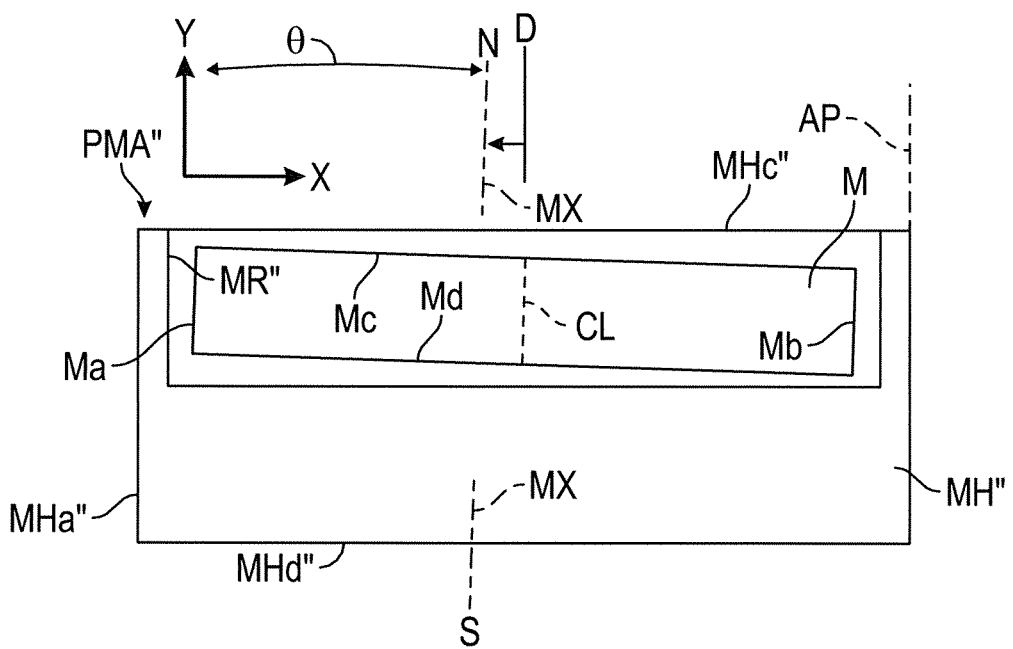
FIG. 1E is identical to FIG. 1D except that it illustrates two common magnet mounting errors that lead to magnet position sensing errors.
Figure 2:
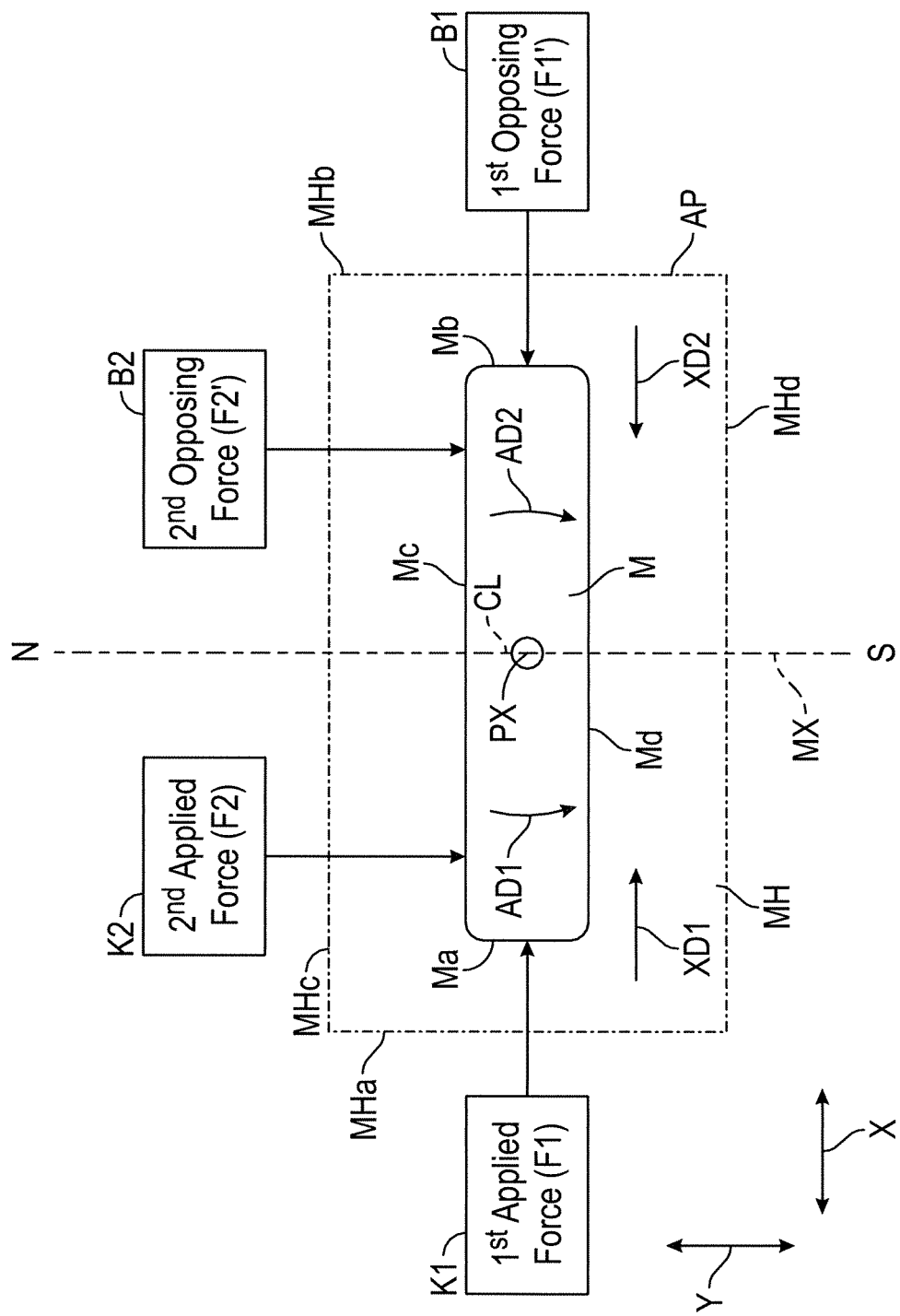
FIG. 2 is a diagrammatic illustration of a magnet holder including a magnet and shows a system for adjusting alignment and location of the magnet relative to the magnet holder in accordance with one embodiment of the present development.

FIG. 2 shows a system and method for adjusting the alignment and location of a magnet M relative to a magnet holder MH in accordance with one embodiment of the present development. The magnet M is identical to the magnet M described above, and the magnet holder MH is identical to the above-described magnet holder MH" except as otherwise shown and/or described herein. Alternatively, the magnet holder MH and magnet M can be configured as shown for the magnet M' and magnet holder MH' of FIG. 1B without departing from the scope and intent of the present development. Corresponding components relative to the magnet holder MH" have been identified with like reference identifiers that omit the double-primed (") notation.

Figure 3:
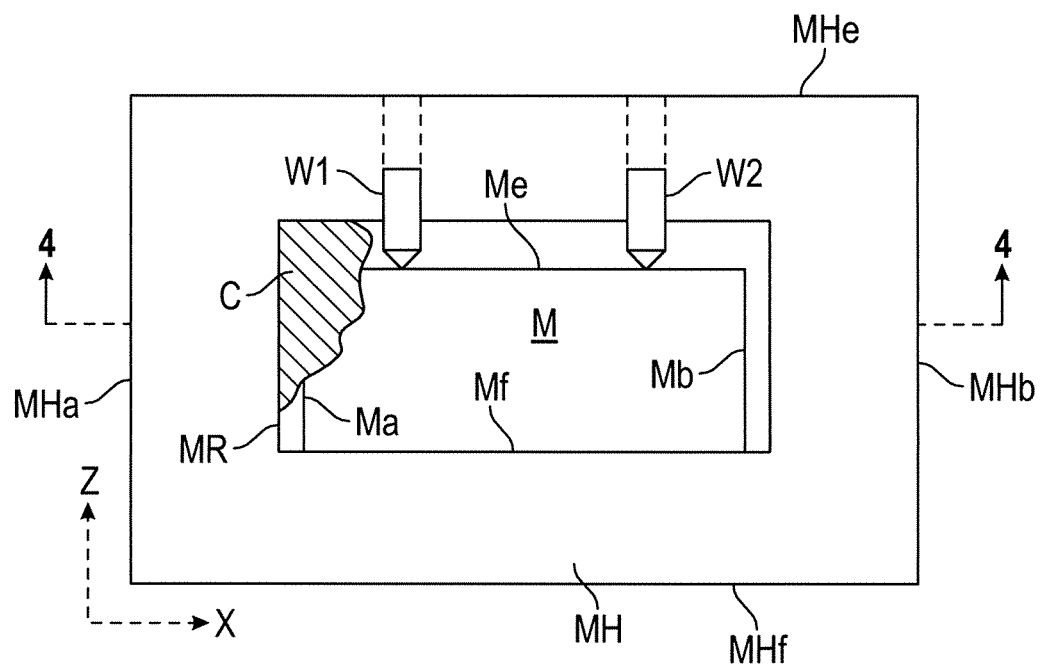
FIG. 3 is a front view of a first embodiment of a magnet holder including a magnet immovably operably secured to the magnet holder using at least one set screw.

The magnet M is mounted to the magnet holder MH in a select position with respect to the three-dimensional XYZ coordinate system as described above such that:
the X axis position of the magnet M determines the X axis position of the magnet M relative to and between opposite left and right lateral sides MHa,MHb of the magnet holder MH;
the Y axis position of the magnet M determines the Y axis position of the magnet M relative to and between the opposite front and rear walls or faces MHc,MHd of the magnet holder MH;
the Z axis position of the magnet M determines the position of the magnet M along the Z axis between opposite upper (top) and lower (bottom) sides MHe, MHf of the magnet holder MH (see also FIG. 3).

The magnet M includes or defines a polar or magnetic axis MX such that the magnet M includes opposite north and south magnetic poles N,S that are spaced apart from each other along the magnetic axis MX. The magnet M also includes: (i) opposite first (left) and second (right) lateral sides Ma,Mb located on opposite lateral sides of the magnetic axis MX and spaced apart from each other along the X axis; (ii) opposite outer (north) and inner (south) faces Mc,Md oriented respectively toward the north and south poles N,S and spaced apart from each other along the Y axis; (iii) opposite upper (top) and lower (bottom) sides Me,Mf (see FIG. 3) spaced apart from each other along the Z axis; and, (iv) a geometric centerline CL that is located halfway or at the midpoint between its opposite lateral edges Ma,Mb along the X axis and that is typically laterally offset slightly relative to the magnetic axis MX due to manufacturing tolerances as described in detail above (the magnetic axis MX and centerline are shown as being coincident in FIG. 2).

As noted above, it is desirable to mount the magnet M in the magnet holder MH such that its magnetic axis MX: (i) lies in the YZ plane such that the magnetic axis lies parallel to the Y axis (normal relative to the X axis); and (ii) is located at a known lateral location along the X axis relative to (or located a known distance from) a fixed reference point or "datum" of the magnet holder such as an alignment plane AP that includes or is coincident with a known fixed location of the magnet holder MH such as the second (right) lateral side MHb of the magnet holder MH as shown herein. The presently disclosed system and method allow either one or both of these optimum conditions to be obtained or achieved as described below.

As shown in FIG. 2, the present system for adjusting the alignment and location of the magnet M relative to the magnet holder MH comprises a first actuator K1 for exerting a first applied force F1 on the magnet M and comprises a second actuator K2 for exerting a second applied force F2 on the magnet M. The system further comprises a first biasing device B1 for exerting a first biasing or opposing force F1' on the magnet and a second biasing device B2 for exerting a second biasing or opposing force F2' on the magnet M. The first opposing force F1' acts on the magnet M in an opposite direction as compared to the first applied force F1 and the second opposing force F2' acts on the magnet M in an opposite direction as compared to the second applied force F2. The first and second applied forces F1,F2 can each be applied directly or indirectly to the magnet M using a respective mechanical actuator such as an adjustment screw threadably engaged with the magnet holder MH or using respective pusher rods that each extend through the magnet holder MH to engage the magnet M. Similarly, the first and second opposing forces F1',F2' can each be applied directly or indirectly to the magnet M using a mechanical biasing member or structure such as a reaction spring engaged between the magnet M and magnet holder MH or by respective resilient reaction devices or rods which are rigid or resiliently spring-biased and that extend through the magnet holder MH and/or that are otherwise engaged with the magnet M.

As shown in FIG. 2, the first applied force F1 is applied to a first lateral side Ma of the magnet M to move the magnet M linearly along the X axis in a first axial direction XD1 relative to the magnet holder MH against the first opposing force F1' which is applied to the second lateral side Mb of the magnet M to urge the magnet M in a second axial direction XD2 along the X axis which is opposite the first axial direction. The first applied force F1 and second opposing force F1' are modulated relative to each other to move the magnet M linearly along the X axis relative to the magnet holder MH in the first and second opposite axial directions XD1,XD2 until the magnetic axis MX is located at a select distance from a fixed reference location or fixed reference datum of the magnet holder MH such as one of the first and second opposite lateral sides MHa,MHb of the magnet holder MH or the alignment plane AP. Similarly, the second applied force F2 is applied to the magnet M (to one of the north and south faces Mc,Md of the magnet M) to pivot or rotate the magnet M relative to the magnet holder MH in a first angular direction AD1 about a pivot axis PX that lies parallel to the Z, while the second opposing force F2' acts on and urges the magnet M in a second angular direction AD2 about the pivot axis PX which is opposite the first angular direction. The second applied force F2 and second opposing force FT are modulated relative to each other to rotate or pivot the magnet M in relative to the magnet holder MH in the first and second opposite angular directions AD1,AD2 about the pivot axis PX until the magnetic axis MX is oriented parallel to the Y axis or parallel to the YZ plane. Once the magnet M is positioned in the desired location relative to the magnet holder MH in its operative position, the magnet M is immovably secured in such operative position using any suitable structure(s), method(s), and/or compound(s) such as set screws that are threadably engaged with the magnet housing MH and that retain the magnet M, an adhesive compound (such as an epoxy or potting compound), fasteners that immovably secure the magnet M to the magnet holder MH, and/or any other known fastening structure or method for fixedly securing the magnet M to the holder MH.

FIG. 3 is a front view of an embodiment of a magnet holder MH including a magnet M immovably operably secured to the magnet holder MH using at least one set screw such as first and second set screws W1,W2. The magnet holder MH defines a recess or space MR in which the magnet M is located. In the illustrated example, the set screws W1,W2 are threaded into the magnet holder MH and engage the top or upper edge Me of the magnet M to force the magnet into immovable engagement with an opposite edge of the recess MR but the location of either one or both of the set screws W1,W2 can be altered. The magnet holder recess MR is sufficiently larger than the magnet M to allow the X axis position of the magnet M and the angular position of the magnet about the Z axis to be adjusted as described above. The one or more of set screws W1,W2 can be used as a temporary fastening device to secure the magnet M or as a final permanent fastening device to fixedly secure the magnet M within the magnet holder recess MR. For example, once the magnet M is immovably secured relative to the magnet holder using one or more set screws W1,W2, a potting compound C or other adhesive can additionally or alternatively be introduced into the recess MR to permanently and immovably secure the magnet M in a fixed location in the recess MR or other mounting location of the magnet holder MH. If a potting compound C or other adhesive is used, the set screws W1,W2 can optionally be removed.

Figure 4:
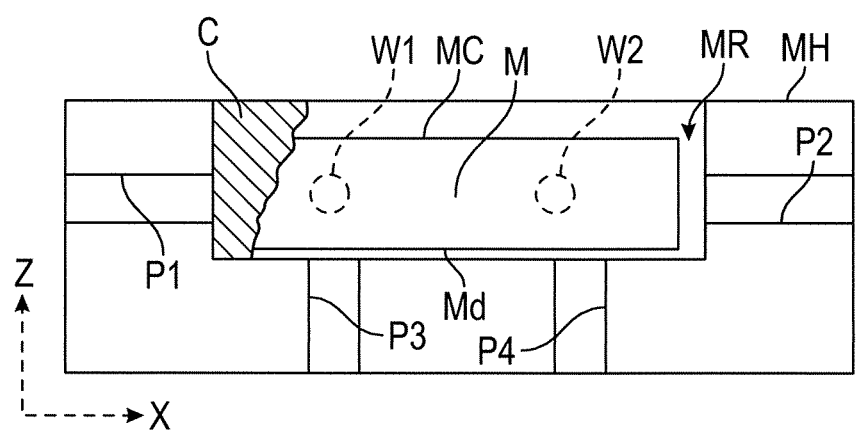
FIG. 4 is a section view taken at view line 4-4 of FIG. 3.

FIG. 4 is a section view taken at view line 4-4 of FIG. 3. It can be seen that the magnet holder MH includes or defines first and second passages or openings P1,P2 that communicate with the space MR adjacent the opposite lateral sides Ma,Mb of the magnet M, respectively. The first and second passages P1,P2 provide access openings for the first actuator K1 and the first biasing device B1 to exert the first applied force F1 and the first biasing or opposing force F1' on the opposite lateral sides Ma,Mb of the magnet M. The magnet holder MH optionally includes or defines third and fourth passages or openings P3,P4 that communicate with the space MR adjacent the north or south face Mc,Md of the magnet (depending upon the installation orientation of the magnet M in the recess MR). The third and fourth passages P3,P4 provide access openings for the second actuator K2 and the second biasing device B2 to exert the second applied force F2 and the second biasing or opposing force F2' on the magnet M.

Figure 5:
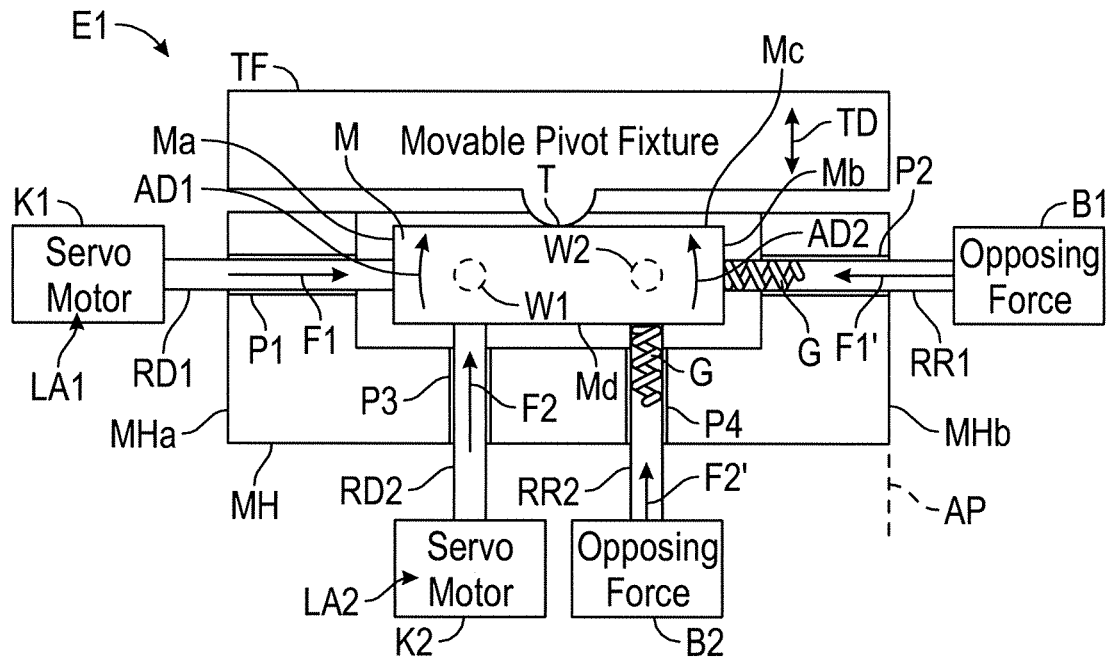
FIG. 5 shows a system for adjusting the alignment and location of the magnet relative to the magnet holder in accordance with a first embodiment of the present development using an external pivot.

FIG. 5 shows a first embodiment E1 of a system for adjusting the alignment and location of the magnet M relative to the magnet holder MH in accordance with the present development using an external pivot T that is connected to a movable pivot fixture TF. The external pivot T defines a pivot point where it contacts the magnet M such that the magnet M pivots or rotates in the first and second angular directions AD1,AD2. The system E1 comprises the movable pivot fixture TF that includes the external pivot T that is movable relative to the magnet holder MH (and/or vice versa) as indicated by the arrow TD to selectively bring the external pivot T into abutment with the north or south face Mc,Md of the magnet, depending upon which face Mc,Md is facing outwardly from the magnet holder recess MR (the north face Mc as shown herein). The first embodiment E1 further comprises first and second servo motor linear actuators LA1,LA2 or other linear actuators that comprise respective first and second pusher devices or pusher rods RD1,RD2 (sometimes referred to as "pushers") that extend through the magnet holder passages P1,P3 to respectively exert the first and second applied forces F1,F2 on the magnet M. The pusher rods RD1,RD2 are movably bi-directionally along the X axis as controlled by the linear actuators LA1,LA2. The first embodiment E1 also comprises first and second biasing devices B1,B2 that each comprise a resilient or compliant spring-biased reaction device such as a resilient reaction rod ("spring-rod") RR1, RR2 including or otherwise engaged with a spring G or other resilient biasing device for respectively exerting the first and second biasing or opposing forces F1',F2' on the magnet M. Alternatively, the reaction devices/rods RR1,RR2 can be rigid and/or can be controlled (whether rigid or resiliently compliant) to move bi-directionally along the X axis by a servo controlled linear actuator or another actuator.

In use, the set screws W1,W2 are retracted and disengaged from the magnet M and the movable pivot fixture TF is moved into its operative position relative to the magnet holder MH so that the pivot T is in contact with the magnet M. The first and second pusher rods RD1,RD2 are engaged with the magnet M through the passages P1,P3 and the first and second reaction rods RR1,RR2 are engaged with the magnet M through the second and fourth passages P2,P4. The position of the magnet M is adjusted as described above in relation to FIG. 2 by controlling or modulating the first applied force F1 and first opposing force F1' relative to each other to laterally shift the magnet M and by controlling or modulating the second applied force F2 and second opposing force F2' relative to each other to angularly rotate the magnet M. When the magnet M is optimally operatively positioned, the set screws W1,W2 are engaged with the magnet M to immovably secure the magnet M relative to the holder MH. Thereafter, the pusher rods and reaction rods RD1,RD2,RR1,RR2 are withdrawn from the magnet holder MH and the potting compound C, another adhesive, or one or more additional fasteners can be used to fixedly secure the magnet M in its optimal operative position relative to the holder MH (as noted above, the set screws W1,W2 can be used as the final securement device to fixedly secure the magnet in its optimal operative position relative to the holder MH).

As shown in FIGS. 9A-9F, during the above-described adjustment process, the position of the magnetic axis MX is detected using a sensor or first and second sensors that detect the magnetic field direction of the magnet M in the sensor's space. If a single sensor is used, it is moved between first and second sensor reference positions PX1,PX2 in line with the desired (reference) position $MX_{REF}$ of the magnetic axis. If two sensors are used, they are located respectively at the first and second sensor reference positions PX1,PX2. During the magnet position adjustment process for adjusting the position of the magnetic axis MX, the sensor or sensors are used to detect the direction of the magnetic field of the magnet M at these two sensor reference positions PX1,PX2. The lateral or X-axis position of the magnet M (and thus of the magnetic axis MX) is adjusted as shown in broken lines and indicated by the arrows LA in FIGS. 9A,9C,9E when the respective X-axis components of the magnetic field at the first and second sensor reference positions PX1,PX2 are either both positive or both negative, i.e., when the X-axis position of the magnetic axis MX is either positively offset relative to both sensor reference positions PX1,PX2 or negatively offset relative to both sensor reference positions PX1,PX2. In this lateral adjustment process, the lateral or X-axis position of the magnet M is adjusted in the required direction (opposite the direction of the sensed X-axis offset of the magnetic axis MX relative to the sensor reference positions PX1,PX2) until the first and second sensor reference positions PX1,PX2 are located on opposite sides of the magnetic axis MX the as indicated by the broken line MX', i.e., until the respective X-axis components of the magnetic field at the two sensor reference positions PX1,PX2 have opposite signs (one is positive and the other is negative). Additionally, the position of the magnet M (and thus its magnetic axis MX) is angularly adjusted as shown by the arrows AA in FIGS. 9B & 9D when the X-axis component of the magnetic field at both sensor reference positions PX1,PX2 are of opposite signs, i.e., when the first and second sensor reference positions PX1,PX2 are located on opposite sides of the magnetic axis MX. In this angular adjustment process, the angular position of the magnet M about a pivot axis parallel to the Z axis is adjusted in the required direction (opposite the direction of the sensed X-axis offset of the magnetic axis MX relative to the sensor reference position PX2 located farthest from the pivot axis) until both the first and second sensor reference positions PX1,PX2 are again located on the same side of the magnetic axis MX as indicated by the broken line MX' in FIGS. 9B & 9D, i.e., until the respective X-axis components of the magnetic field at the two sensor reference positions PX1,PX2 have the same signs (both are positive or both are negative). The position of the magnet M and its magnetic axis MX is iteratively angularly and laterally adjusted using the above-described lateral and angular adjustment processes (beginning with which of the two adjustment steps are indicated by the starting position of the magnetic axis MX relative to the first and second sensor reference locations PX1,PX2) until the X-axis component of the magnetic field at both sensor reference positions PX1, PX2 (the X-axis offset of the magnetic axis relative to both sensor reference positions PX1,PX2) is equal to zero or as close as is required for acceptable alignment of the magnetic axis MX with the plane AP or other datum of the magnet holder MH. When the alignment process is complete, the magnetic axis MX will be coincident with the reference position $MX_{REF}$.

Figure 10A:
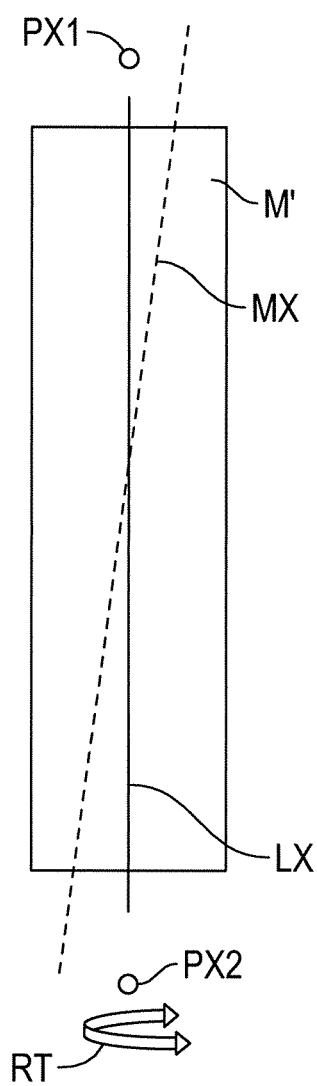
FIGS. 10A & 10B illustrate another process for adjusting the position of a magnet and its magnetic axis in accordance with an embodiment of the present development.
Figure 10B:
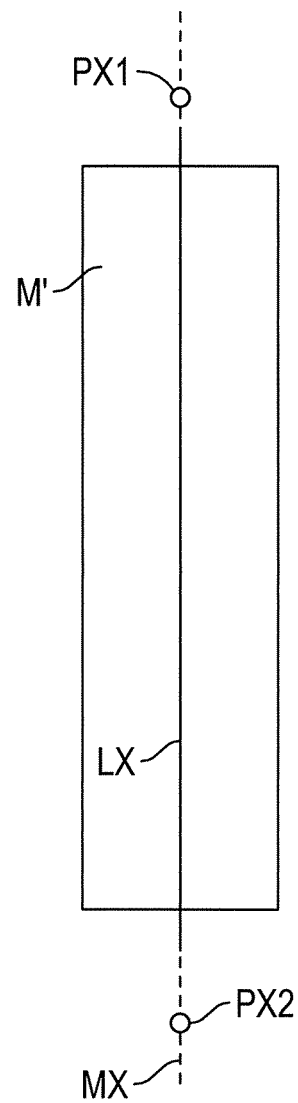

Those of ordinary skill in the art will recognize that for a cylindrical magnet M' as shown in FIG. 1B, the magnetic axis may be undesirably angled or skewed relative to the geometric central longitudinal axis rather than being coincident with the geometric central longitudinal axis. In such case, the angled or skewed magnetic axis can be aligned as required in accordance with the present development by rotating the magnet M' about its geometric central longitudinal axis (which lies parallel to the Y axis) until the magnetic axis lies in a plane that is parallel to the Y-Z plane. This rotational alignment process can also be performed with a non-cylindrical magnet such as a rectangular magnet M. In one such example, as shown in FIGS. 10A & 10B, a magnet such as a cylindrical magnet M' includes a geometric central longitudinal axis LX and a magnetic axis MX that is skewed relative to the magnet central axis LX. The position of the magnetic axis MX is detected using a sensor or first and second sensors that detect the magnetic field direction of the magnet M' in the sensor's space. The magnetic axis MX can be determined to lie in the Y-Z plane when a magnetic field sensor aligned with the central axis LX detects that the magnitude of the X-axis component of the magnetic field is minimized between minimum and maximum values. If the magnetic axis MX is angled relative to the central longitudinal axis LX but also intersects the longitudinal axis, the X-axis component of the magnetic field will equal zero when the magnetic axis MX lies in a plane parallel to the Y-Z plane. If the magnetic axis MX is skewed relative to the magnet central longitudinal axis LX such that it does not intersect the longitudinal axis LX, the magnet M' is rotated about its longitudinal axis until the magnitude of the X-axis component of the magnetic field is minimized, i.e., the X-axis component value is midway between its maximum positive value and minimum negative value during rotation of the magnet M' about its longitudinal axis LX. In one embodiment, a single sensor is located at either sensor reference position PX1 or PX2 and the magnet M' is rotated about its central axis LX as shown by the arrow RT in FIG. 10A until the single sensor located at either location PX1 or PX2 detects that the X-axis component of the magnetic field is minimized. In such an embodiment, only a single sensor is required at one of the sensor reference positions PX1,PX2. Alternatively, a single sensor can be used and be moved between first and second sensor reference positions PX1, PX2 that are in line with the desired (reference) position of the magnetic axis (the geometric centerline LX of the magnet M' in the present example). If two sensors are used, they can be located respectively at the first and second sensor reference positions PX1,PX2 located adjacent the opposite axial ends of the magnet M' as shown in FIGS. 10A & 10B, but they can alternatively be located similarly to FIGS. 9A-9F such that they are both located adjacent the same axial end of the magnet M' (as shown by sensor reference locations PX1,PX2' in FIG. 10A). During the magnet position adjustment process for adjusting the position of the magnetic axis MX based upon sensing the magnetic field of the magnet M' at two sensor locations PX1,PX2, the sensor (or respective sensors) are used to detect the direction of the magnetic field of the magnet M' at these two sensor reference positions PX1,PX2 and the position of the magnet M' (and thus of the magnetic axis MX) is adjusted by rotating the magnet M' in either direction about its central axis LX as shown by the arrow RT in FIG. 10A until the magnitude of the respective X-axis components of the magnetic field at the two sensor reference positions PX1,PX2 are minimized between minimum and maximum values (and equal to each other) indicating that the magnetic axis MX lies in a plane that is parallel to the Y-Z plane. The position of the magnet M' and its magnetic axis MX can be iteratively angularly adjusted using the above-described angular adjustment processes until the a magnetic axis MX of the magnet M' is located at a desired position relative to said first and second sensor reference positions PX1,PX2 indicating that the magnetic axis MX lies in a plane that is parallel to the Y-Z plane.

Figure 6:
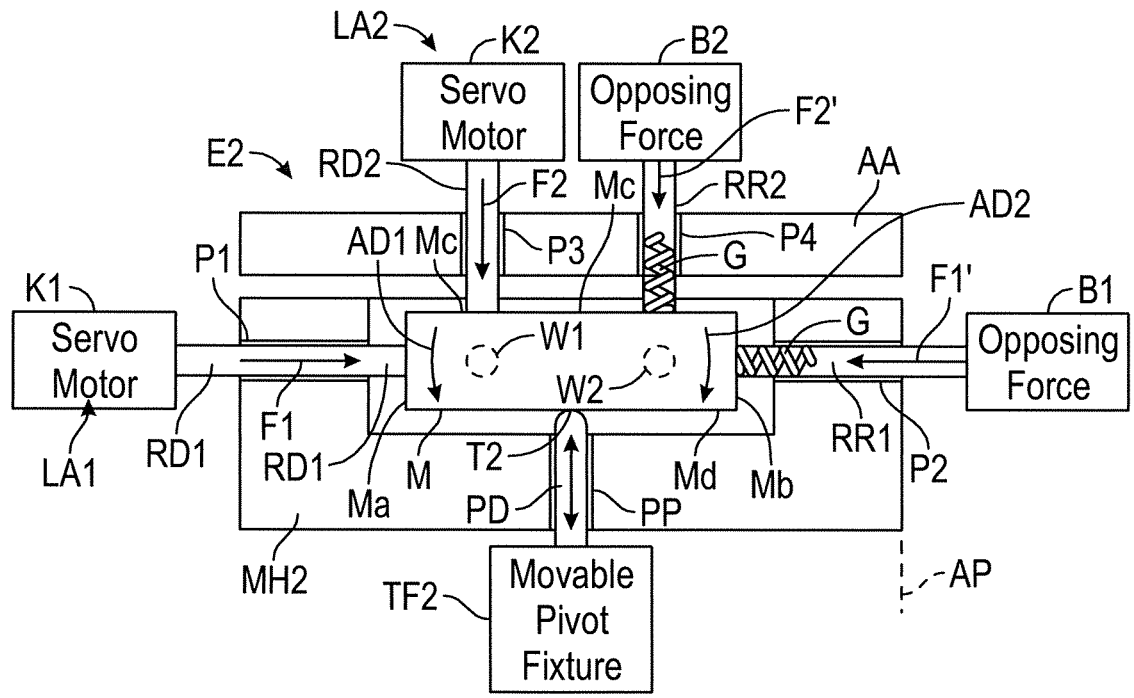
FIG. 6 is similar to FIG. 5 but shows a system for adjusting the alignment and location of the magnet relative to the magnet holder in accordance with a second embodiment of the present development using an internal movable pivot fixture.

FIG. 6 is similar to FIG. 5 but shows a system E2 for adjusting the alignment and location of the magnet M relative to the magnet holder MH2 in accordance with a second embodiment of the present development using an internal movable pivot fixture TF2. The magnet holder MH2 is similar to the magnet holder MH except that it comprises a pivot passage PP and omits the third and fourth passages P3,P4. A movable pivot fixture PF comprises a pivot rod PD comprising a distal end that includes a pivot T2. The pivot rod PD is extended through the pivot passage PP so that the pivot T2 extends into the recess MR and abuts the north or south face Mc,Md of the magnet M depending upon the installed orientation of the magnet (the pivot MT contacts the south face Md of the magnet M in the illustrated example). The movable pivot T thus defines a pivot point about which the magnet rotates in the first and second angular directions AD1,AD2. The second embodiment E2 further comprises an angular adjustment fixture AA that is moved or located adjacent the magnet holder MH and that includes or is otherwise operatively associated with the second actuator K2 and the second biasing device B2 for exerting the second applied force F2 and the second opposing force FT on the magnet M, particularly on the face Mc of the magnet that is opposite the face Md that is contacted by the pivot MT to rotate the magnet M in the first and second angular directions AD1,AD2. When the magnet M is optimally operatively positioned as described above in relation to FIG. 2, the set screws W1,W2 are engaged with the magnet M to immovably secure the magnet relative to the holder MH2. Thereafter, the pivot rod PD, pusher rods RD1,RD2 and reaction rods RR1,RR2 are withdrawn from the recess MR and disengaged from the magnet M and magnet holder MH and the potting compound C, another adhesive, or one or more additional fasteners can be used to fixedly secure the magnet Min its optimal operative position in the recess MR of the holder MH.

Figure 7:
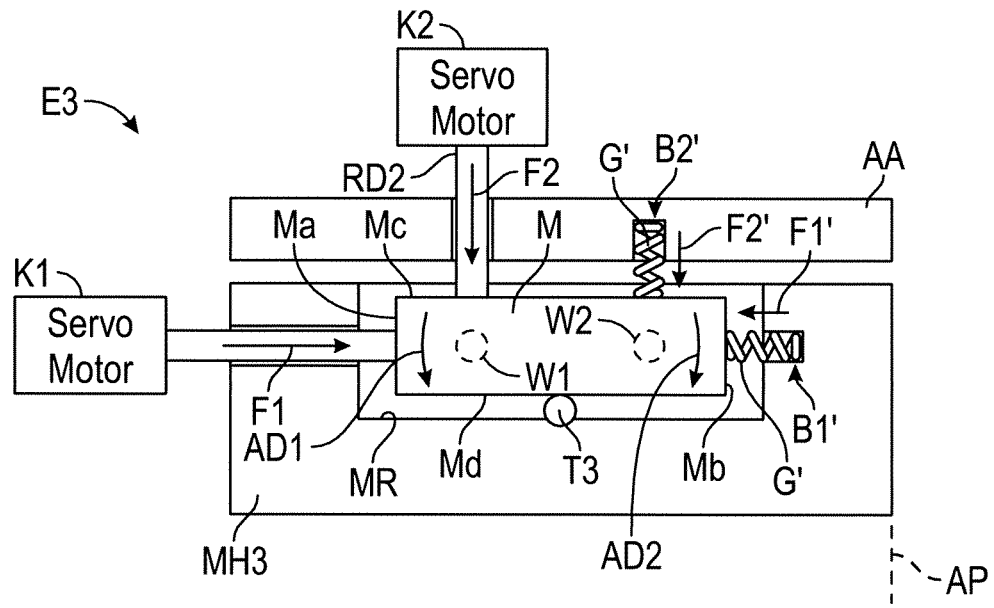
FIG. 7 is similar to FIG. 5 but shows a system for adjusting the alignment and location of the magnet relative to the magnet holder in accordance with a third embodiment of the present development using a fixed internal pivot and an internal biasing device.

FIG. 7 is similar to FIG. 6 but shows a system E3 for adjusting the alignment and location of the magnet M relative to the magnet holder MH3 in accordance with a third embodiment of the present development. Unlike the magnet holder MH2 of FIG. 6, the magnet holder MH3 includes a fixed internal pivot T3 that defines the pivot point for the magnet M to rotate in the first and second angular directions AD1,AD2. The internal pivot T3 is located in the recess MR and is engaged with the north or south face Mc,Md of the magnet M depending upon the installed orientation of the magnet M in the recess (the south face Md in the example of FIG. 7). Also, the embodiment E2 includes a first biasing device B1' comprising a first spring G' connected to the magnet holder MH3 and projecting into the recess MR so as to be engaged with the second lateral side Mb of the magnet M. The spring G' exerts the first opposing force F1' (or first biasing force F1') on the magnet M in opposition to the first applied force F1. Similarly, the angular adjustment fixture AA optionally includes a second biasing device B2' comprising a second spring G' that is engaged with the exposed north or south face Mc,Md of the magnet M (the north face Mc in the present example). The second spring G' exerts the second opposing force F2' (or second biasing force F2') on the magnet M in opposition to the second applied force F2. The first and second springs G' are shown as helical coil springs, any other suitable spring can be used such as a leaf spring, an elastomeric pad or block spring, a polymeric spring leaf molded into the magnet housing MH3 or adjustment fixture AA, or any other resilient member or body.

Figure 8:
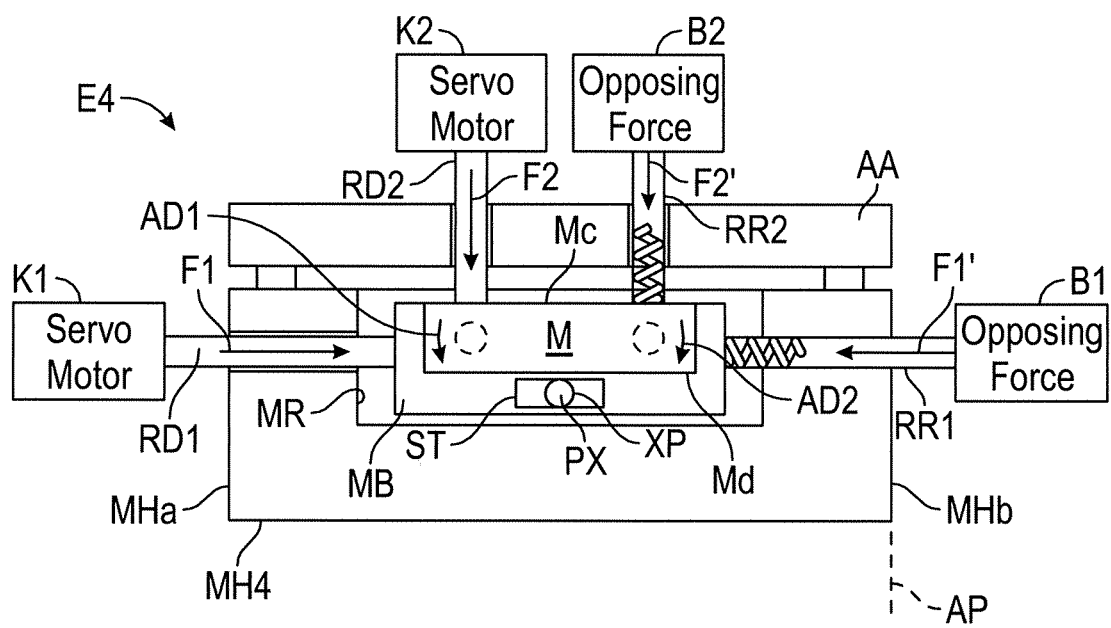
FIG. 8 shows a system for adjusting the alignment and location of the magnet relative to the magnet holder in accordance with a fourth embodiment of the present development using movable mounting block connected to the magnet holder.
Figure 9A:
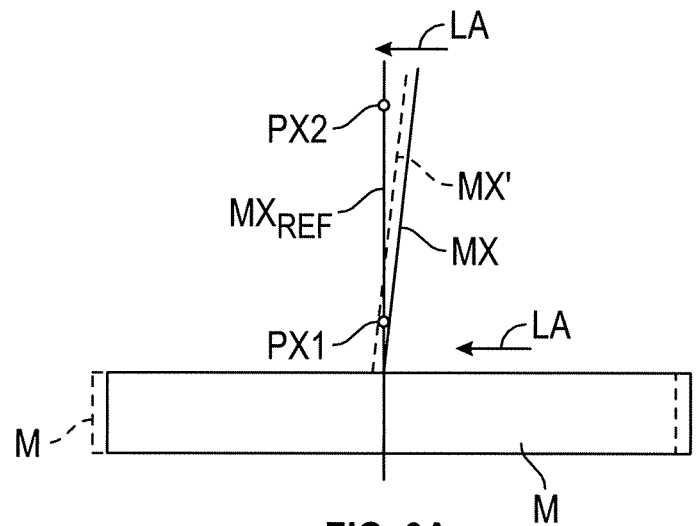
FIGS. 9A-9F illustrate a process for adjusting the position of a magnet and its magnetic axis in accordance with an embodiment of the present development.
Figure 9B:
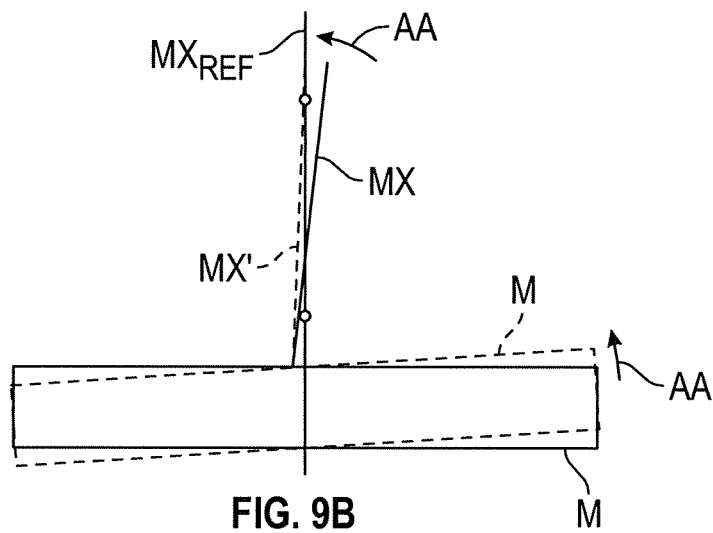
Figure 9C:
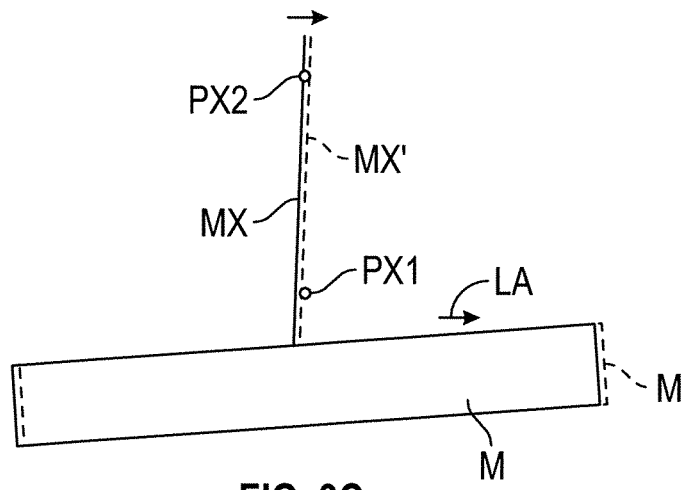
Figure 9D:
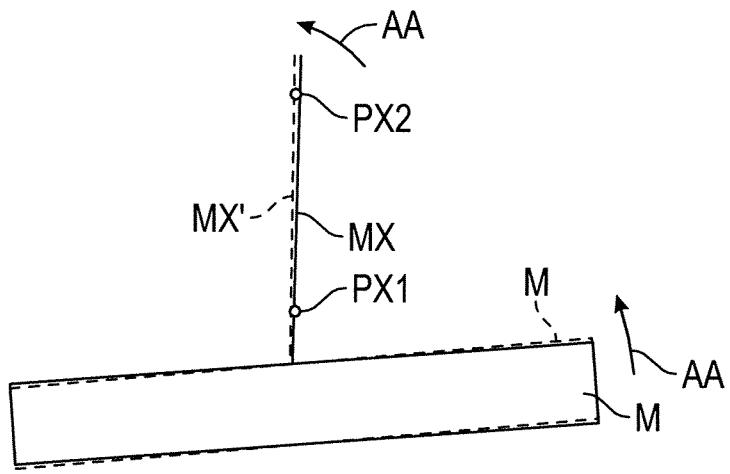
Figure 9E:
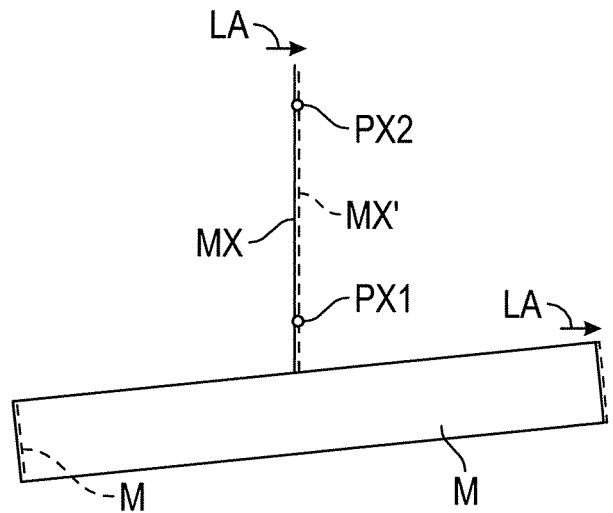
Figure 9F:
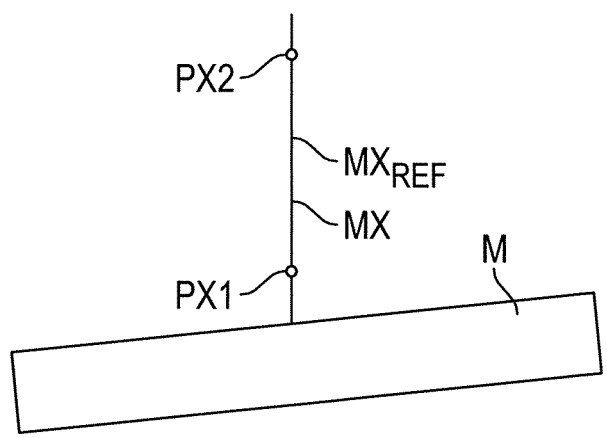

FIG. 8 shows a system for adjusting the alignment and location of the magnet M relative to the magnet holder MH in accordance with a fourth embodiment E4 of the present development. The embodiment E4 comprises a magnet holder MH4 that includes a movable mounting block MB located in the recess MR. The magnet M is supported by and immovably mounted in or connected to the mounting block MB using an adhesive, fastener, snap-fit, friction-fit, or another fastening device or means. The movable mounting block MB is pivotally and slidably connected to the magnet holder MH such that the movable mounting block MB pivots about a pivot axis PX that is parallel to the Z axis and such that the mounting block MB also moves laterally in the recess MR along the X axis bi-directionally toward and away from the opposite lateral sides MHa,MHb of the magnet holder MH4. In the illustrated embodiment, the mounting block MB includes an elongated slot ST and the magnet holder MH4 includes a pivot pin XP located in the recess MR and oriented parallel to the Z axis. The pivot pin XP extends through the elongated slot ST of the mounting block MB such that the mounting block MB pivots bi-directionally about the Z axis in the first and second angular directions AD1,AD2 and also slides bi-directionally along the X axis relative to the magnet holder MH4. Otherwise, the embodiment E4 is identical to the second embodiment E2 except that the pusher rod RD1 and reaction rod RR1 indirectly exert the first applied force F1 and the first opposing force F1' on the magnet M through the mounting block MB. The mounting block MB can alternatively be structured to movably support the magnet M and described while also allowing direct contact between either the pushing rod RD1 and/or the reaction rod RR1 and the magnet M. Alternatively, the mounting block can cover part of the exposed north or south face Mc,Md of the magnet M, in which case the second applied force F2 and/or the second opposing force F2' can also be indirectly exerted on the magnet M through the mounting block MB. Furthermore, the fourth embodiment E4 can alternatively include one or both of the alternative first and second biasing devices B1',B2' including the springs G' for respectively exerting the opposing forces F1',F2' directly or indirectly on the mounting block MB and/or magnet M.

It should be noted that a coil spring, leaf spring, polymeric spring, or any other spring such as the spring G' can be used to provide the first and/or second opposing or biasing forces F1',F2' for any embodiment E1-E4 disclosed herein. In such case, a spring G' is mounted to the magnet holder MH, MH2,MH3,MH4 and/or to the angular adjustment fixture AA and is resiliently engaged between the magnet holder MH and the magnet M, or is resiliently engaged between the angular adjustment fixture AA and the magnet M, and/or is resiliently engaged between the magnet holder MH4 and the mounting block MB such that the spring G' exerts the first and/or second biasing/opposing force F1',F2' on the magnet M or mounting block MB as described above. Furthermore, as noted, although the spring G' is shown as helical coil spring that acts in compression, any other suitable spring can be used such as a leaf spring, an elastomeric pad or block spring, a polymeric spring molded into the magnet housing MH,MH2,MH3,MH4, or any other resilient member or body that can act in tension or compression on the magnet M.

According to one embodiment, the disclosed method for adjusting the alignment and location of a magnet includes providing a magnet holder MH,MH2,MH3,MH4 and a magnet M carried by the magnet holder. The method includes using a first actuator K1 to exert a first applied force F1 on the magnet M to urge the magnet M in a first axial direction XD1 relative to the magnet holder and using a first biasing device B1,B1' to exert a first opposing force F1' on the magnet M to urge the magnet in a second axial direction XD2 relative to the magnet holder, wherein the second axial direction XD2 is opposite the first axial direction XD1. The first applied force F1 and the first opposing force F1' are modulated relative to each other to position the magnet M and its magnetic axis MX at a select lateral location relative to the magnet holder. The method also includes using a second actuator K2 to exert a second applied force F2 on the magnet M to urge the magnet in a first angular direction AD1 about a pivot axis PX relative to the magnet holder and using a second biasing device B2,B2' to exert a second opposing force F2' on the magnet to urge the magnet in a second angular direction AD2 about the pivot axis PX relative to the magnet holder, wherein the second angular direction AD2 is opposite the first angular direction AD1. The second applied force F2 and the second opposing force F2' are modulated relative to each other to position the magnet M and its magnetic axis MX at a select angular orientation relative to the magnet holder. The magnet is immovably secured to magnet holder in an operative position defined by the select lateral position and the select angular orientation.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An adjustment system for adjusting the alignment and location of a magnet, said system comprising:
   a magnet holder;
   a magnet carried by the magnet holder;
   a first actuator that exerts a first applied force on the magnet to urge the magnet in a first axial direction;
   a first biasing device that exerts a first opposing force on the magnet to urge the magnet in a second axial direction opposite the first axial direction;
   a magnet fastener that immovably secures the magnet to magnet holder in an operative position.

2. The adjustment system as set forth in claim 1, further comprising:
   a second actuator that exerts a second applied force on the magnet to urge the magnet in a first angular direction about a pivot axis;
   a second biasing device that exerts a second opposing force on the magnet to urge the magnet in a second angular direction opposite the first angular direction.

3. The adjustment system as set forth in claim 2, wherein at least some of said first and second applied forces and said first and second opposing forces are exerted directly on the magnet.

4. The adjustment system as set forth in claim 3, wherein all of said first and second applied forces and said first and second opposing forces are exerted directly on the magnet.

5. The adjustment system as set forth in claim 2, further comprising:
   a mounting block movably connected to the magnet holder;
   wherein said magnet is connected to said mounting block.

6. The adjustment system as set forth in claim 5, wherein said mounting block pivots bi-directionally relative to said magnet holder and wherein said mounting block moves linearly bi-directionally relative to said magnet holder.

7. The adjustment system as set forth in claim 6, wherein:
   both said first applied force and said first opposing force are exerted indirectly on the magnet through said mounting block; and,
   said second applied force and said second opposing force are exerted directly on the magnet.

8. The adjustment system as set forth in claim 1, wherein said a first actuator comprises a linear actuator and said first biasing device comprises a resilient reaction device.

9. The adjustment system as set forth in claim 8, wherein said linear actuator comprises a servo motor controlled linear actuator and wherein said resilient reaction device comprises a spring.

10. The adjustment system as set forth in claim 9, wherein said spring is located between and operatively engaged with said magnet holder and said magnet.

11. The adjustment system as set forth in claim 8, wherein said resilient reaction device comprises a spring-biased rod.

12. The adjustment system as set forth in claim 2, wherein said magnet holder comprises first and second passages defined and wherein the first actuator and the first biasing device respectively extend through the first and second passages into operative engagement the magnet.

13. The adjustment system as set forth in claim 12, wherein said magnet holder further comprises third and fourth passages defined and wherein the second actuator and the second biasing device respectively extend through the third and fourth passages into operative engagement the magnet.

14. The adjustment system as set forth in claim 2, further comprising a pivot engaged with the magnet, wherein the magnet rotates in said first and second angular directions on said pivot.

15. The adjustment system as set forth in claim 14, wherein said pivot is connected to said magnet holder.

16. The adjustment system as set forth in claim 15, wherein said magnet holder comprises a recess in which said magnet is received, and wherein said pivot is located in said recess.

17. The adjustment system as set forth in claim 14, wherein said pivot is separate from said magnet holder and provided on a magnet fixture that is selectively located adjacent said magnet holder.

18. An adjustment method for adjusting the alignment and location of a magnet relative to at least one of first and second sensor reference positions, said method comprising:
   (a) providing a magnet holder and a magnet carried by the magnet holder;
   (b) one of:
   (i) sensing a magnetic field of the magnet at both said first and second sensor reference positions and adjusting a lateral position of said magnet along an X-axis if respective X-axis components of the magnetic field at both said first and second sensor reference positions have the same sign;
   (ii) sensing the magnetic field of the magnet at both said first and second sensor reference positions and adjusting an angular position of said magnet about a pivot axis that is perpendicular to said X-axis if respective X-axis components of the magnetic field at both said first and second sensor reference positions have opposite signs;
   (iii) sensing a magnetic field of the magnet at one or both of the first and second sensor reference positions and adjusting a rotational position of said magnet about a central axis of said magnet;
   (c) repeating step (b) until a magnetic axis of said magnet is located at a desired position.

19. The adjustment method as set forth in claim 18, wherein said method comprises:
   using a first actuator to exert a first applied force on the magnet to urge the magnet in a first axial direction relative to the magnet holder;
   using a first biasing device to exert a first opposing force on the magnet to urge the magnet in a second axial direction relative to the magnet holder, wherein the second axial direction is opposite the first axial direction;
   modulating the first applied force and the first opposing force relative to each other to position the magnet at a select lateral location relative to the magnet holder;
   using a second actuator to exert a second applied force on the magnet to urge the magnet in a first angular direction about a pivot axis relative to the magnet holder;
   using a second biasing device to exert a second opposing force on the magnet to urge the magnet in a second angular direction about the pivot axis relative to the magnet holder, wherein the second angular direction is opposite the first angular direction;

modulating the second applied force and the second opposing force relative to each other to position the magnet at a select angular orientation relative to the magnet holder;

immovably securing the magnet to magnet holder in an operative position defined by the select lateral position and the select angular orientation.

20. An adjustment method for adjusting the alignment and location of a magnet, said method comprising:
(a) sensing a magnetic field of a magnet at first and second sensor reference positions;
(b) one of: (i) laterally adjusting a position of said magnet along an X-axis if respective X-axis components of the magnetic field at both said first and second sensor reference positions have the same sign; (ii) angularly adjusting a position of said magnet about a pivot axis that is perpendicular to said X-axis if said respective X-axis components of the magnetic field at both said first and second sensor reference positions have opposite signs;
(c) iteratively repeating steps (a) and (b) until a magnetic axis of said magnet is located at a desired position relative to said first and second sensor reference positions.

* * * * *